United States Patent
Hayashi

(10) Patent No.: US 11,637,228 B2
(45) Date of Patent: Apr. 25, 2023

(54) LIGHT EMITTING DEVICE AND ELECTRODE SUBSTRATE

(71) Applicant: Japan Display Inc., Tokyo (JP)

(72) Inventor: Hirotaka Hayashi, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 140 days.

(21) Appl. No.: 17/198,296

(22) Filed: Mar. 11, 2021

(65) Prior Publication Data
US 2021/0296548 A1 Sep. 23, 2021

(30) Foreign Application Priority Data

Mar. 23, 2020 (JP) .............................. JP2020-051035

(51) Int. Cl.
| | |
|---|---|
| H01L 33/62 | (2010.01) |
| H01L 33/60 | (2010.01) |
| H01L 27/12 | (2006.01) |
| H01L 25/075 | (2006.01) |

(52) U.S. Cl.
CPC .......... *H01L 33/62* (2013.01); *H01L 25/0753* (2013.01); *H01L 27/1214* (2013.01); *H01L 33/60* (2013.01)

(58) Field of Classification Search
CPC ........................... H01L 25/0753; H05B 33/00
See application file for complete search history.

(56) References Cited

U.S. PATENT DOCUMENTS

| | | | | |
|---|---|---|---|---|
| 10,756,136 | B1* | 8/2020 | Ma ...................... | H01L 31/147 |
| 2008/0284315 | A1* | 11/2008 | Tasumi ................. | H01L 33/501 |
| | | | | 313/503 |
| 2011/0186874 | A1* | 8/2011 | Shum .................. | H01L 25/0753 |
| | | | | 257/E33.059 |
| 2012/0113328 | A1* | 5/2012 | Takeshima ............ | H01L 33/647 |
| | | | | 257/88 |

FOREIGN PATENT DOCUMENTS

JP  2011-29634 A  2/2011

* cited by examiner

*Primary Examiner* — Andrew J Coughlin
(74) *Attorney, Agent, or Firm* — Xsensus LLP

(57) ABSTRACT

A light emitting device includes a first insulating layer disposed on the substrate, a first electrode pattern and a second electrode pattern disposed on a first surface of the first insulating layer, at least one LED chip including a first terminal and a second terminal, and the first terminal electrically connected to the first electrode pattern and the second terminal electrically connected to the second electrode pattern, and a reflective pattern disposed on a second surface side of the first insulating layer opposite to the first surface. The first electrode pattern and the second electrode pattern are electrically separated by a first gap, and the reflective pattern includes a linear pattern overlapping with the first gap.

12 Claims, 8 Drawing Sheets

LIGHT EMITTING DEVICE AND ELECTRODE SUBSTRATE

CROSS-REFERENCE TO RELATED APPLICATION

This application is based upon and claims the benefit of priority from the prior Japanese Patent Application No. 2020-051035, filed on Mar. 23, 2020, the entire contents of which are incorporated herein by reference.

FIELD

An embodiment of the present invention relates to the structure of at least one wiring and reflector of a light emitting device, in which a light-emitting diode (LED) is mounted.

BACKGROUND

The light emitting diodes (LED) are used as light sources for electronic devices. For example, LED chips are used as a backlight system of a liquid crystal display device. The development of the display device in which the pixel is formed by the LED chip is advanced. There are minute bare chip-like LEDs called mini LEDs and micro LEDs, which are directly mounted on a substrate using conductive paste or the like on the surfaces of a pair of electrodes.

SUMMARY

A light emitting device in an embodiment according to the present invention includes a first insulating layer disposed on the substrate, a first electrode pattern and a second electrode pattern disposed on a first surface of the first insulating layer, at least one LED chip including a first terminal and a second terminal, and the first terminal electrically connected to the first electrode pattern and the second terminal electrically connected to the second electrode pattern, and a reflective pattern disposed on a second surface side of the first insulating layer opposite to the first surface. The first electrode pattern and the second electrode pattern are electrically separated by a first gap, and the reflective pattern includes a linear pattern overlapping with the first gap.

An electrode substrate in an embodiment according to the present invention includes a first insulating layer disposed on the substrate, a first electrode pattern and a second electrode pattern disposed on a first surface of the first insulating layer, and a reflective pattern disposed on a second surface side of the first insulating layer opposite to the first surface. The first electrode pattern and the second electrode pattern are electrically separated by a first gap, and the reflective pattern includes a linear pattern overlapping with the first gap.

DESCRIPTION OF EMBODIMENTS

Figure 1:
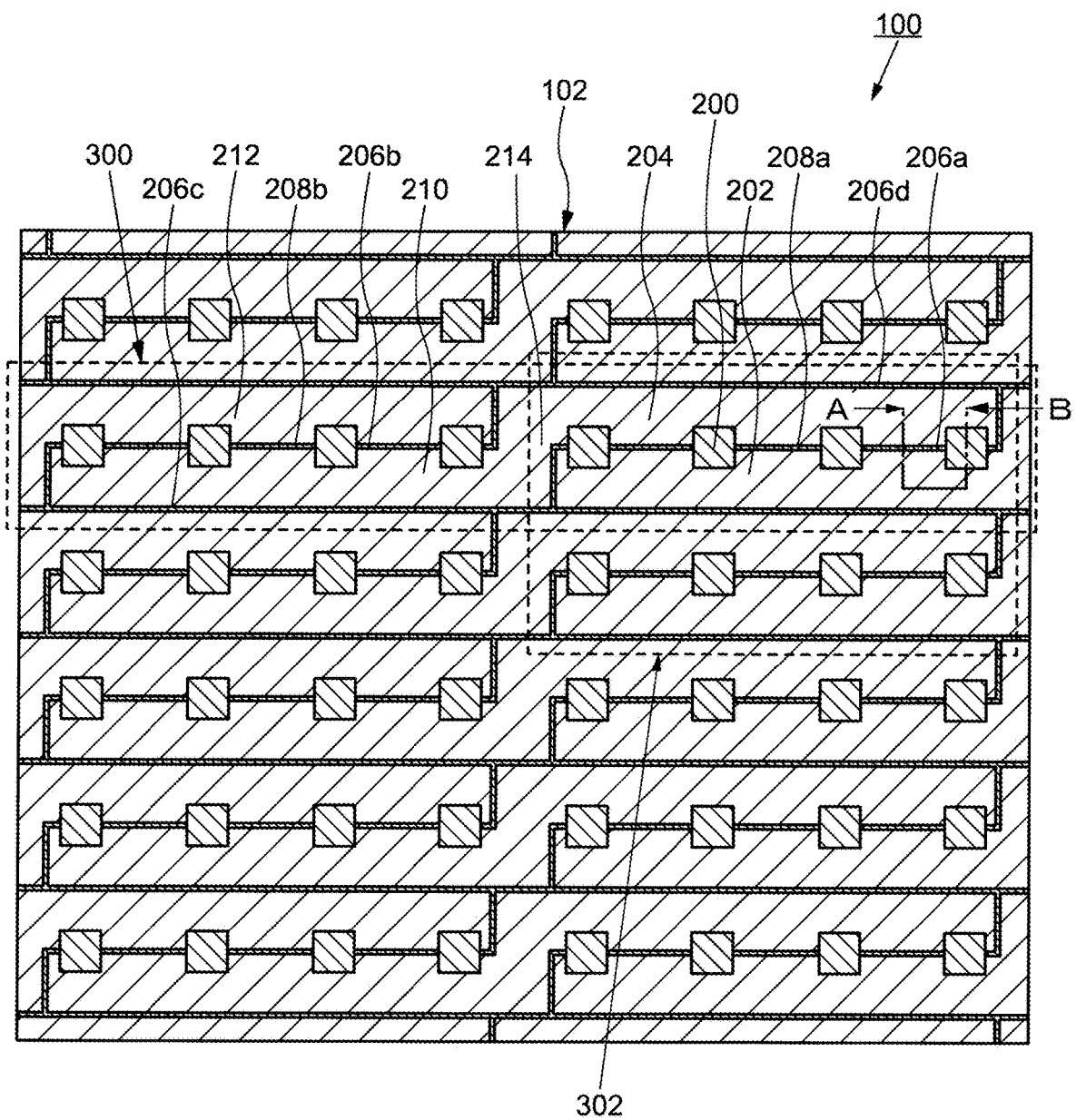
FIG. 1 is a plan view showing a configuration of the light emitting device according to an embodiment of the present invention.

Hereinafter, embodiments of the present invention will be described with reference to the drawings and the like. The present invention may be carried out in various embodiments, and should not be construed as being limited to any of the following embodiments. In the drawings, components may be shown schematically regarding the width, thickness, shape and the like, instead of being shown in accordance with the actual sizes, for the sake of clear illustration. The drawings are merely examples and do not limit the present invention in any way. In the specification and the drawings, components that are substantially the same as those described or shown previously bear the identical reference signs thereto (or the identical reference signs followed by letters "a", "b" or the like), and detailed descriptions thereof may be omitted. The terms "first", "second" and the like used for elements are merely provided for distinguishing the elements and do not have any other significance unless otherwise specified.

In this specification, when certain components or region is considered to be "above (or below)" of another component or region, this includes, without particular limitation, not only when it is directly above (or directly below) another component or region, but also when it is above (or below) another component or region. That is, it includes the case where another component is included in between above (or downward) the other component or region. In the following description, the direction in which the first and second electrode patterns are installed with respect to the substrate shall be referred to as "up", "upward", "top" or "top side", and vice versa as "bottom", "downward", "bottom side" or "bottom surface side".

In one embodiment of the present invention, a micro LED refers to a chip size of several micrometers or more and 100 μm or less, and a mini LED refers to a chip size of 100 μm or more. In one embodiment of the present invention, LEDs of any size can be used, and can be appropriately used depending on the application and form of the light emitting device.

FIG. 1 shows a configuration of a light emitting device 100 according to an embodiment of the present invention. The light emitting device 100 includes a first electrode pattern 202, a second electrode pattern 204, and an electrode substrate 102 provided with a reflection pattern 208a. The light emitting device 100 has a structure in which the electrode substrate 102 is mounted with an LED chip 200.

The first electrode pattern 202 and the second electrode pattern 204 are disposed on the insulating surface, and they are adjacently arranged. A gap (or slit) 206a for electrically separating them is provided between the first electrode pattern 202 and the second electrode pattern 204. For example, the first electrode pattern 202 and the second electrode pattern 204 have a constant width as shown in FIG.

and are formed in a rectangular pattern in a plan view. The gap 206a is provided along the first electrode pattern 202 and the second electrode pattern 204. The reflection pattern 208a is provided so as to overlap the pattern of the gap 206a. The insulating surface is formed by an insulating layer (not shown). The first electrode pattern 202 and the second electrode pattern 204 are provided on the first surface side of the insulating layer (not shown), and the reflection pattern 208a is provided on the second surface side opposite to the first surface side of the insulating layer (not shown). The first electrode pattern 202, the second electrode pattern 204, and the reflection pattern are electrically insulated from each other by the insulating layer (not shown).

The LED chip 200 is a two-terminal element having a first terminal (for example, an anode) and a second terminal (for example, a cathode). In the LED chip 200, for example, the first terminal is electrically connected to the first electrode pattern 202, and the second terminal is electrically connected to the second electrode pattern 204. Since the first electrode pattern 202 and the second electrode pattern 204 are electrically connected to the LED chip 200, they can be regarded simply as electrodes. For the electrical connection between at least one LED chip 200 and the first electrode pattern 202 and the second electrode pattern 204, a conductive member (for example, carbon paste, silver paste, solder, or the like) is used. The at least one LED chip 200 may include a plurality of LED chips. As shown in FIG. 1, the plurality of LED chips 200 are connected in parallel by the first electrode pattern 202 and the second electrode pattern 204. In other words, when the first electrode pattern 202 and the second electrode pattern 204 are rectangular patterns, the plurality of LED chips 200 are mounted along the longitudinal direction thereof. The plurality of LED chips 200 are preferably spaced apart so that the light emission intensity is uniform when the light emitting device 100 is viewed as a surface light source.

As shown in the region 300 shown in FIG. 1, the electrode substrate 102 includes a third electrode pattern 210 and a fourth electrode pattern 212 which are adjacent to the first electrode pattern 202 and the second electrode pattern 204. When the first electrode pattern 202 and the second electrode pattern 204 are rectangular patterns, the third electrode pattern 210 and the fourth electrode pattern 212 are arranged adjacently in the longitudinal direction of the first electrode pattern 202 and the second electrode pattern 204. The third electrode pattern 210 and the fourth electrode pattern 212 are electrically separated by a gap 206b, and the reflection pattern 208a is provided so as to overlap with the gap 206b. The light emitting device 100 has such a structure that the plurality of LED chips are mounted on the third electrode pattern 210 and the fourth electrode pattern 212.

As shown in FIG. 1, the electrode substrate 102 has a structure in which the second electrode pattern 204 and the third electrode pattern 210 are electrically connected by a wiring pattern 214. In other words, the second electrode pattern 204 and the third electrode pattern 210 are formed as a continuous conductive pattern including the wiring pattern 214. In contrast to the continuous the second electrode pattern 204 and the third electrode pattern 210, the first electrode pattern 202 is electrically separated by the gap 206a, and the fourth electrode pattern 212 is electrically separated by the gap 206b.

As shown by region 300, the light emitting device 100 has a structure in which a plurality of LED chips are connected in series and parallel. FIG. 1 shows a structure that set of four parallel connected LED chips 200 and another set of four parallel connected LED chips 200 adjacent thereto are connected in series in the region 300. The light emitting device 100 further has a configuration in which a plurality of arrays connected in series-parallel are arranged in parallel. In this structure, the first electrode pattern 202 and the third electrode pattern 210 are electrically insulated from the electrode pattern of the adjacent row by a gap 206c, and the second electrode pattern 204 and the fourth electrode pattern 212 are electrically insulated from the electrode pattern of the adjacent row by a gap 206d. The electrode substrate 102 is provided with reflection patterns 208c, 208d in a region overlapping with the gaps 206c, 206d. Since the light-emitting device 100 has such an electrode pattern and the mounting structure of the LED chips, a planar light source can be formed, and the uniformity of the emission intensity in the plane can be enhanced.

As shown in FIG. 1, the first electrode pattern 202, the second electrode pattern 204, the third electrode pattern 210, and the fourth electrode pattern 212 of the light emitting device 100 are rectangular shape, and these electrode patterns are provided so as to extend substantially over the entire surface of the insulating surface except for the gaps 206a, 206b, 206c, 206d. The light emitting device 100 is provided with such a wide electrode patterns and is separated by the gaps, so that the area of the reflecting surface for reflecting the light emitted from the LED chips can be increased. Further, since the reflection patterns 208a, 208b, 208c, 208d overlapping the gaps 206a, 206b, 206c, 206d are arranged, the part of the gaps also becomes a reflection surface, and the light emitted from the LED chips 200 can be effectively utilized. That is, light emitted from the LED chip 200 and leaking downward from the gap 206a separating the first electrode pattern 202 and the second electrode pattern 204 is reflected by the reflection pattern 208a, so that light can be effectively utilized (The same is also applied to the gap with other electrode patterns).

Figure 2:
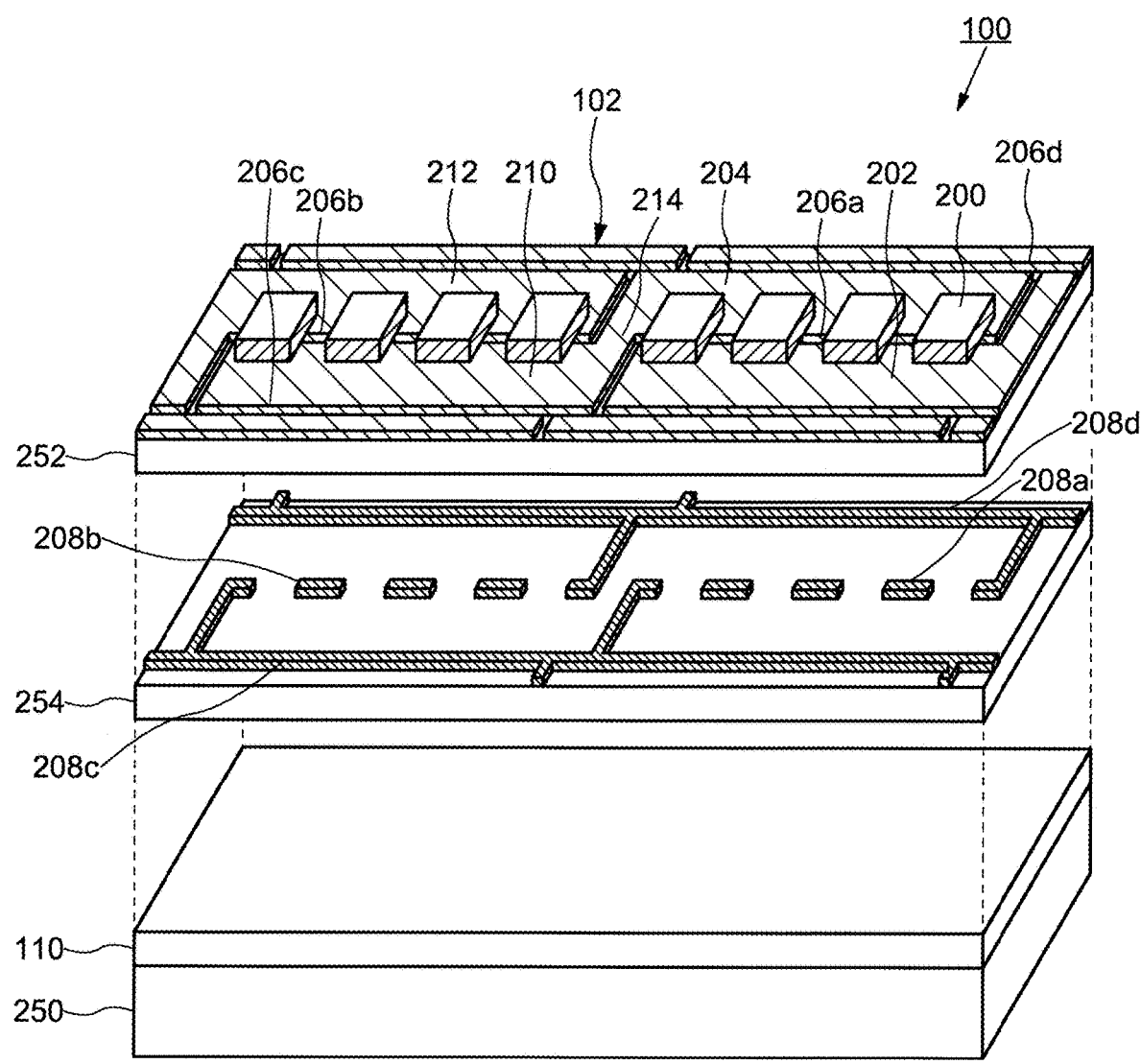
FIG. 2 is an exploded view showing the structure of the region 300 shown in FIG. 1.

FIG. 2 is an exploded view showing the structure of the region 300 shown in FIG. 1. As shown in FIG. 2, the electrode substrate 102 includes at least a first layer on which the first electrode pattern 202 and the second electrode pattern 204 are formed, and a second layer on which the reflection patterns 208a and 208b are formed. The first electrode pattern 202 and the second electrode pattern 204 are disposed on a first surface of a first insulating layer 252. The first electrode pattern 202 and the second electrode pattern 204 have a structure separated by a gap 206a formed on the first insulating layer 252. The third electrode pattern 210 and the fourth electrode pattern 212 are also disposed on the first surface of the first insulating layer 252. The third electrode pattern 210 and the fourth electrode pattern 212 are separated by a gap 206b. As described with reference to FIG. 1, the second electrode pattern 204 and the third electrode pattern 210 are connected by the wiring pattern 214.

The reflection patterns 208a, 208b are disposed on the first surface side of the first insulating layer 252 opposite to the second surface side. In other words, when the electrode substrate 102 is viewed from the first electrode pattern 202 and the second electrode pattern 204 side in plan view, the reflection patterns 208a, 208b are disposed on the lower layer side. That is, the second layer forming the reflection patterns 208a, 208b is disposed below the first layer forming the first electrode pattern 202 and the second first electrode pattern 204. The reflection patterns 208a, 208b are disposed on the first surface side of the second insulating layer 252. The reflection pattern 208a is disposed in a region overlapping the gap 206a, and the reflection pattern 208b is disposed in a region overlapping the gap 206b.

Figure 3A:
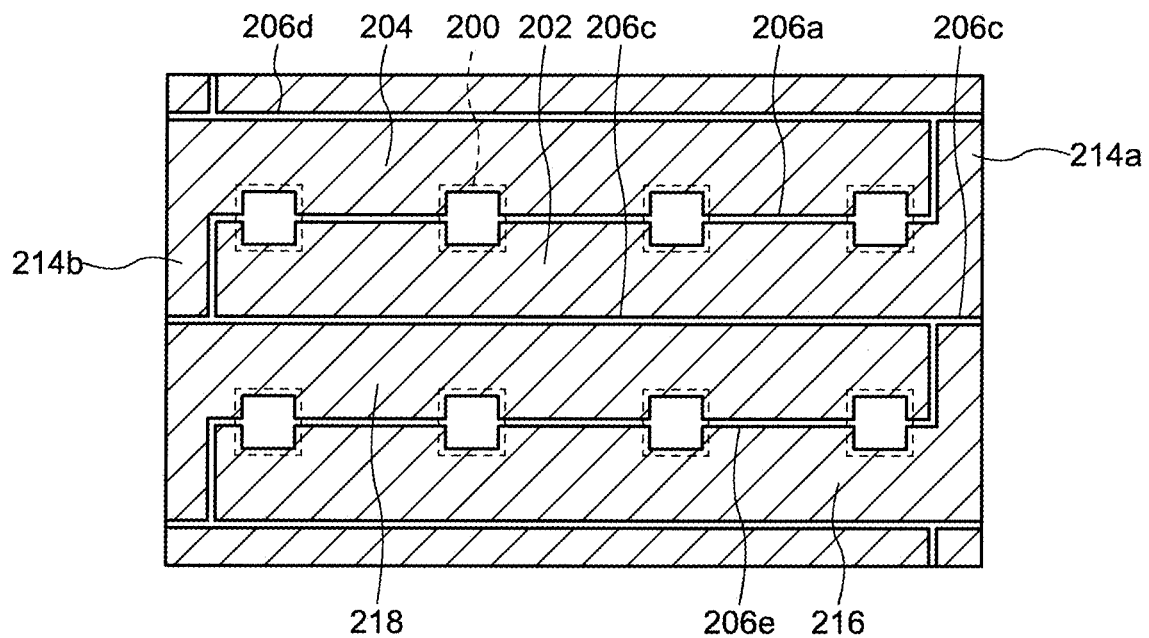
FIG. 3A shows the first electrode pattern and the second electrode pattern of the region 302 shown in FIG. 1.
Figure 3B:
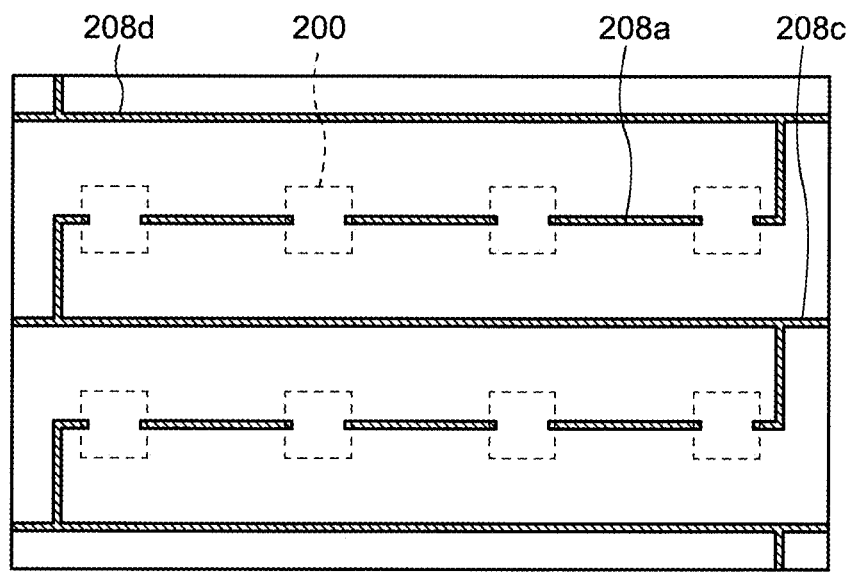
FIG. 3B shows the reflection pattern of the region 302 shown in FIG. 1.

FIG. 3A shows a plan view of the first electrode pattern 202 and the second electrode pattern 204 in the region 302 shown in FIG. 1, and FIG. 3B shows a plan view of the reflection patterns 208a, 208c, 208d in the region 302. As shown in FIG. 3A, the first electrode pattern 202 and the second electrode pattern 204 are separated by the gap 206a. The first electrode pattern 202 is provided with a wiring pattern 214a continuing from a rectangular (can also be rectangular or strip-like) electrode pattern, and the second electrode pattern 204 is provided with a wiring pattern 214b.

FIG. 3A shows an aspect in which the first electrode pattern 202 is arranged adjacently in the lateral direction (as electrode patterns in adjacent rows) with a fifth electrode pattern 216 and a sixth electrode pattern 218. The fifth electrode pattern 216 and the sixth electrode pattern 218 have a structure electrically separated by the gap 206e, and the first electrode pattern 202 and the sixth electrode pattern 218 have a structure electrically separated by a gap 206c.

As shown in FIG. 3B, the reflection pattern 208a may not be disposed in a region overlapping a region where a plurality of LED chips 200 are mounted. In other words, while the reflection patterns 208c, 208d are continuous linear patterns, the reflection pattern 208a is not disposed in a region overlapping a region where a plurality of LED chips 200 are mounted. That is, the reflection patterns 208a, 208b include discrete patterns in regions overlapping the plurality of LED chips 200. It is possible to suppress the occurrence of defects due to static electricity during the manufacturing process by forming the reflection pattern 208a using a discrete pattern. However, the reflection pattern 208a may be arranged so as to overlap the plurality of LED chips 200. According to this structure, since the light emitted below the LED chip 200 is reflected by the reflection pattern 208a, the light can be effectively utilized.

The electrode substrate 102 having such a configuration is provided on the substrate 250. FIG. 2 shows an aspect in which the first insulating layer 252 is interposed between the first electrode pattern 202 and the second electrode pattern 204 and the reflection pattern 208a, but the number of insulating layers is not limited to one layer, and a plurality of insulating layers may be interposed.

FIG. 2 also shows a configuration of the light emitting device 100 in which the plurality of LED chips 200 are mounted. As shown in FIG. 2, the plurality of LED chips 200 are disposed on the first electrode pattern 202, the second electrode pattern 204, the third electrode pattern 210, and the fourth electrode pattern 212. The light emitting device 100 may include a circuit (also referred to as control circuit or drive circuit) for controlling light emission of the plurality of LED chips 200. The control circuit is arranged on the substrate 250. The control circuit is formed of a circuit element including a transistor (specifically, the thin film transistor) or the like. FIG. 2 shows an aspect in which the circuit element layer 110 on which the circuit element is formed is provided on the substrate 250.

Figure 4:
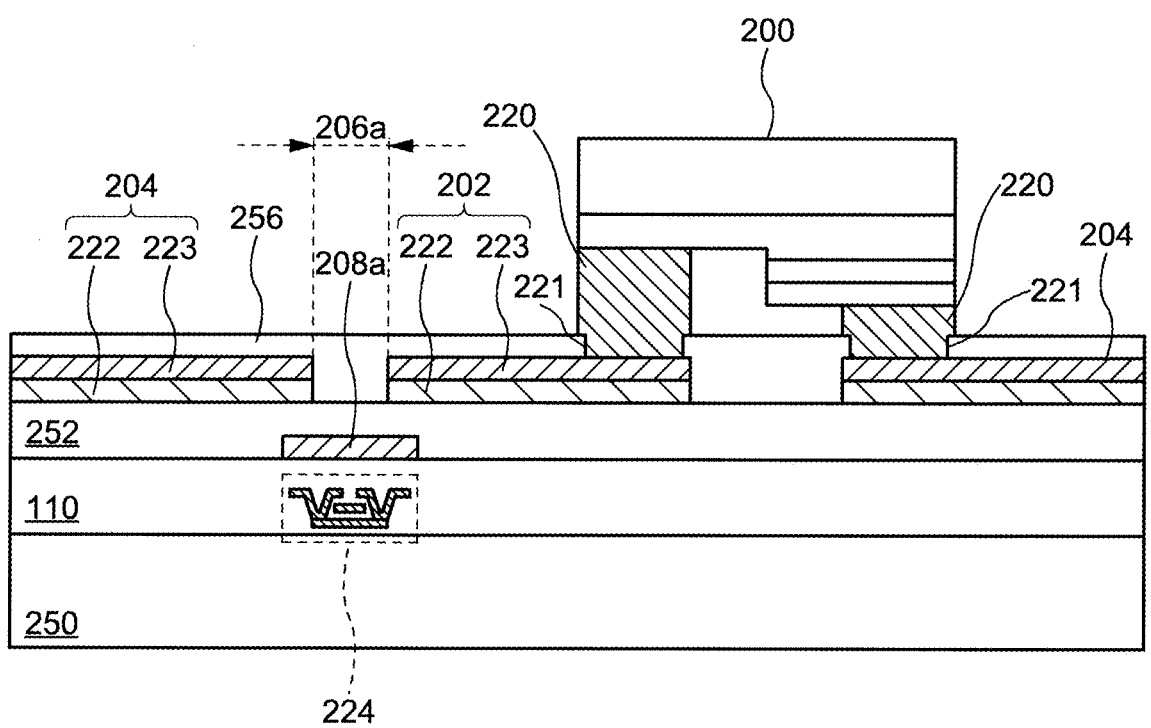
FIG. 4 is a cross-sectional view of the structure along the A-B line shown in FIG. 1.

FIG. 4 shows the cross-sectional structure along the line A-B shown in FIG. 1. As shown in FIG. 4, the first electrode pattern 202 and the second electrode pattern 204 are disposed on the first surface of the first insulating layer 252. The first electrode pattern 202 and the second electrode pattern 204 are formed of a metal material such as aluminum, copper, silver or nickel. The first electrode pattern 202 and the second electrode pattern 204 may have a structure in which a plurality of conductive films are laminated. For example, the first electrode pattern 202 and the second electrode pattern 204 may have a structure in which the first conductive layer 222 and the second conductive layer 223 are laminated. The first conductive layer 222 may be formed of a metal oxide film having conductivity such as indium tin oxide (ITO) and indium zinc oxide (IZO), and the second conductive layer 223 may be formed of a metal film such as aluminum (Al). According to such a configuration, the first electrode pattern 202 and the second electrode pattern 204 can be made to have low resistance by the second conductive layer 223, high light reflectance can be realized by the reflecting surface by the metal film, and peeling of the second conductive layer 223 can be prevented by the first conductive layer 222. The reflective pattern 208a can also be formed of the same material as the first electrode pattern 202 and the second electrode pattern 204 and have the same structure.

A protective layer 256 may be disposed on the first electrode pattern 202 and the second electrode pattern 204. The protective layer 256 is formed of a thin film of a transparent inorganic insulating material or an organic insulating material. Silicon oxide, silicon nitride or the like is used as the thin film of the inorganic insulating material, and acrylic, polyimide or the like is used as the organic insulating material. The electrode pattern can be protected by providing such a protective layer 256.

The LED chip 200 is electrically connected to the first electrode pattern 202 and the second electrode pattern 204 by a conductive member 220. The LED chip 200 is a bare chip and is provided with bumps (not shown). The conductive member is provided in contact with the surface of the bump. The protective layer 256 has an opening 221, and the opening 221 exposes the first electrode pattern 202 and the second electrode pattern 204.

The reflection pattern 208a is provided on the first surface side of the second insulating layer 252 (surface opposite to the first surface on which the electrode pattern is provided). For example, the reflection pattern 208a is provided on the upper surface of the insulating layer included in the circuit element layer 110. The circuit element layer 110 is arranged on the lower layer side of the reflection pattern 208a. The circuit element layer 110 includes a plurality of insulating layers, patterns of a metal film forming wirings and electrodes, and patterns of a semiconductor film forming elements such as transistors. The reflection pattern 208a may be provided so as to cover the circuit element 224 included in the circuit element layer 110. The circuit element 224 is shielded from light by the reflection pattern 208a. The light emitted from the LED chip 200 is shielded by the reflection pattern 208a and does not enter the circuit element 224. For example, when the circuit element 224 is a transistor, the light is blocked by the reflection pattern 208a, so that the fluctuation of the operation characteristic can be prevented. As described above, the reflection pattern 208a has a function as a reflecting mirror for reflecting light passing through the gap 206a, and a function as a light shielding film for light incident on the circuit element layer 110 (light emitted primarily from the LED chip).

It is preferable to form the reflection pattern with a continuous film covering substantially the entire surface of the circuit element layer 110 from the viewpoint of light shielding property, but it is not necessarily preferable from the viewpoint of circuit operation. If the reflection pattern is a continuous film, a parasitic capacitance occurs between the reflection pattern and the wiring and the electrode included in the circuit element layer 110, resulting in an increase in power consumption and a delay in circuit operation. Therefore, as shown in FIG. 2 and FIG. 3B, the reflection pattern 208a is preferably formed in a thin line-like pattern.

Figure 5:
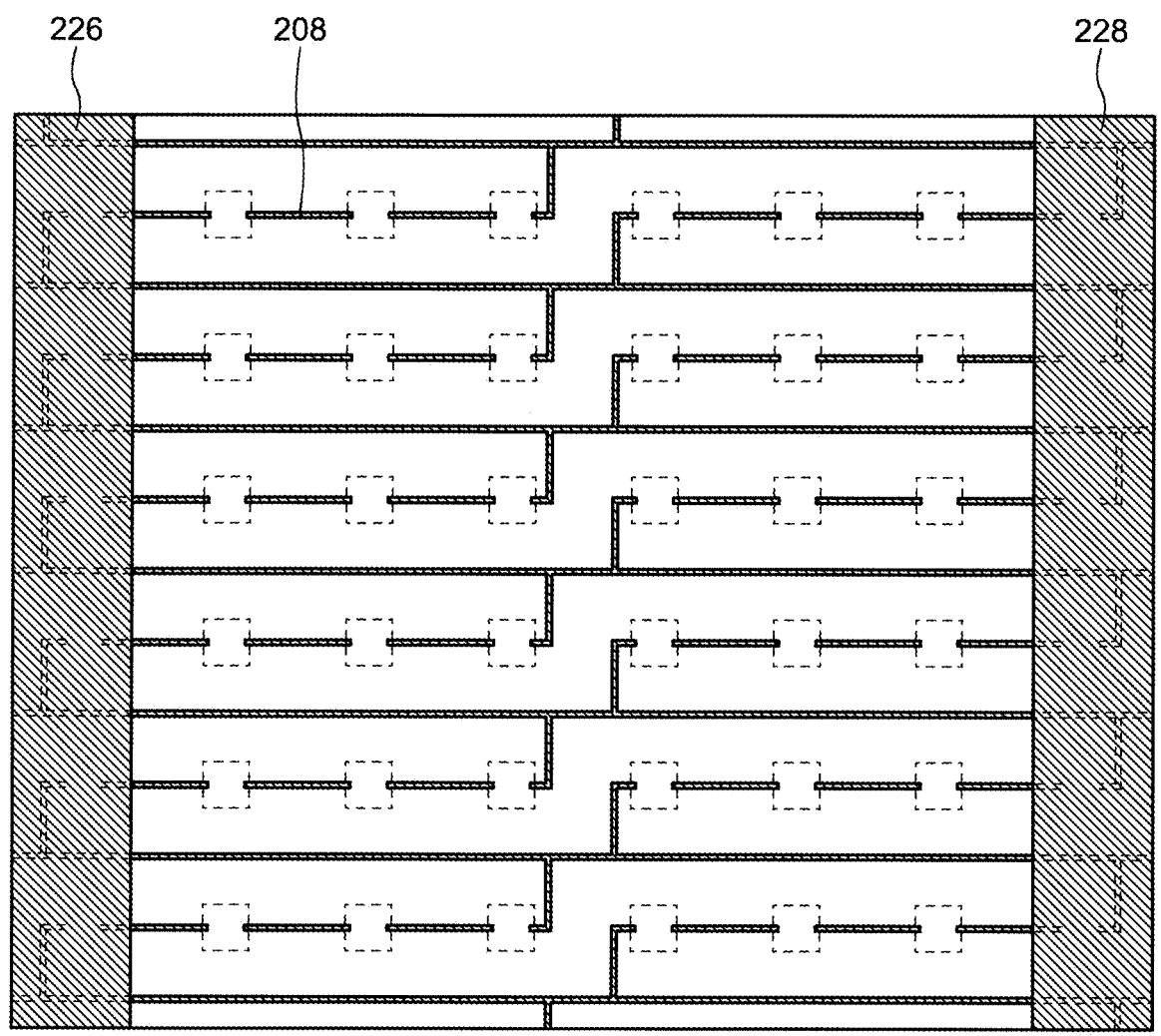
FIG. 5 is a plan view showing a structure of layer on which the reflection pattern is formed in the light emitting device according to an embodiment of the present invention.

As shown in FIG. 5, the first wiring 226 and the second wiring 228 may be provided by the metal layer forming the reflection pattern 208a. The first wiring 226 and the second wiring 228 can be electrically connected to an electrode pattern provided on the first surface side of the first insulating layer 252 by providing a contact hole. Therefore, the first wiring 226 can be used as the wiring on the side of the first terminal of the LED chip 200 (for example, anode wiring), and the second wiring 228 can be used as the wiring on the side of the second terminal of the LED chip 200 (for example, cathode wiring). In this manner, the metal layer for forming the reflection pattern 208a can be used to make the wiring multilayered.

Figure 6:
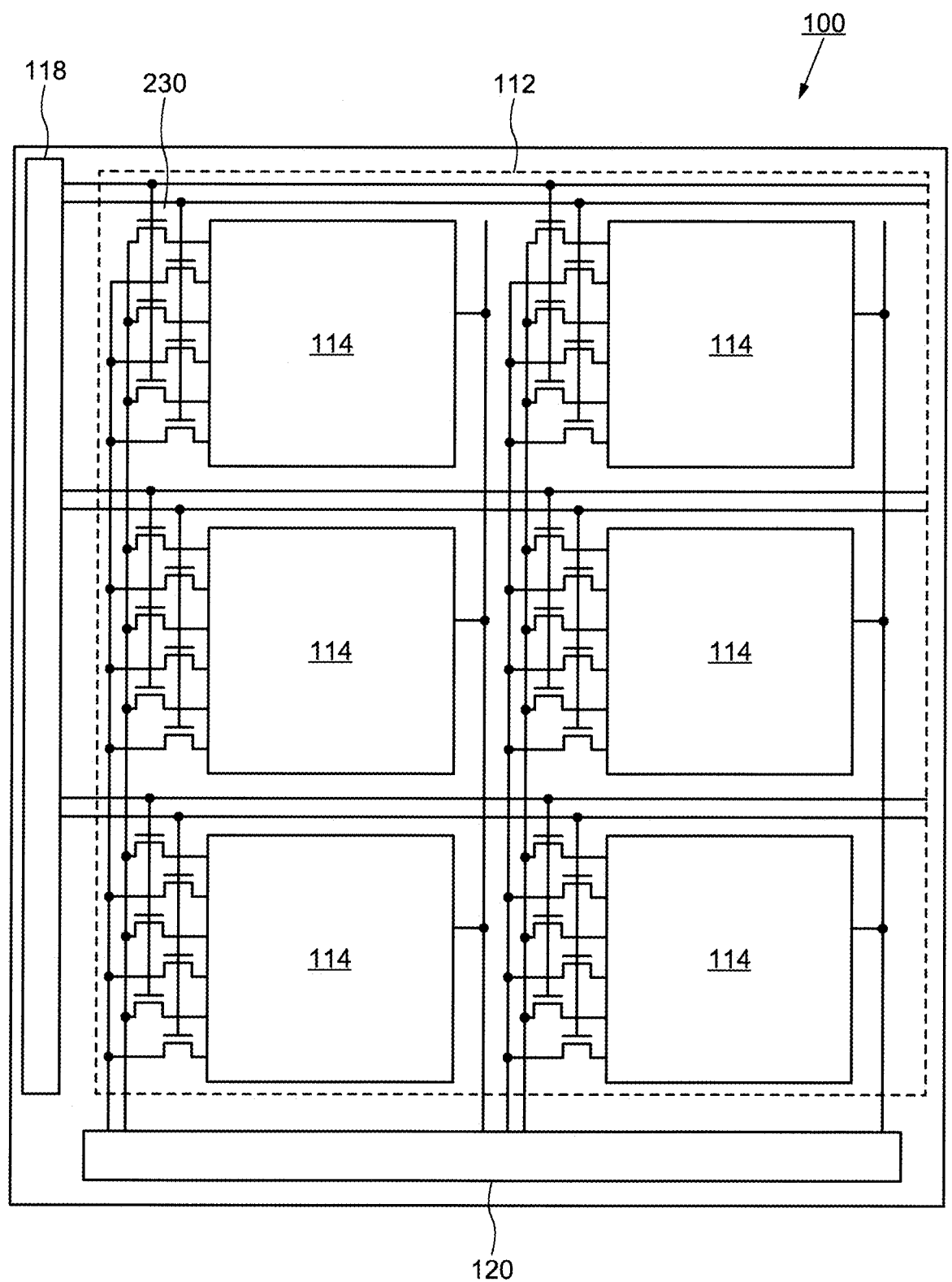
FIG. 6 shows an example of the light emitting device according to an embodiment of the present invention.

FIG. 6 shows an example of a light emitting device 100 according to an embodiment of the present invention. The light emitting device 100 shown in FIG. 6 has a configuration that can be used as a direct backlight. The light emitting part 112 of the light emitting device 100 comprises a plurality of LED arrays 114. The plurality of LED arrays 114 are connected to a power supply circuit 120, and light emission is controlled by a control circuit 118. The light emitting state of the plurality of LED arrays 114 is controlled for every even row and odd row by the switching element 230.

Figure 7:
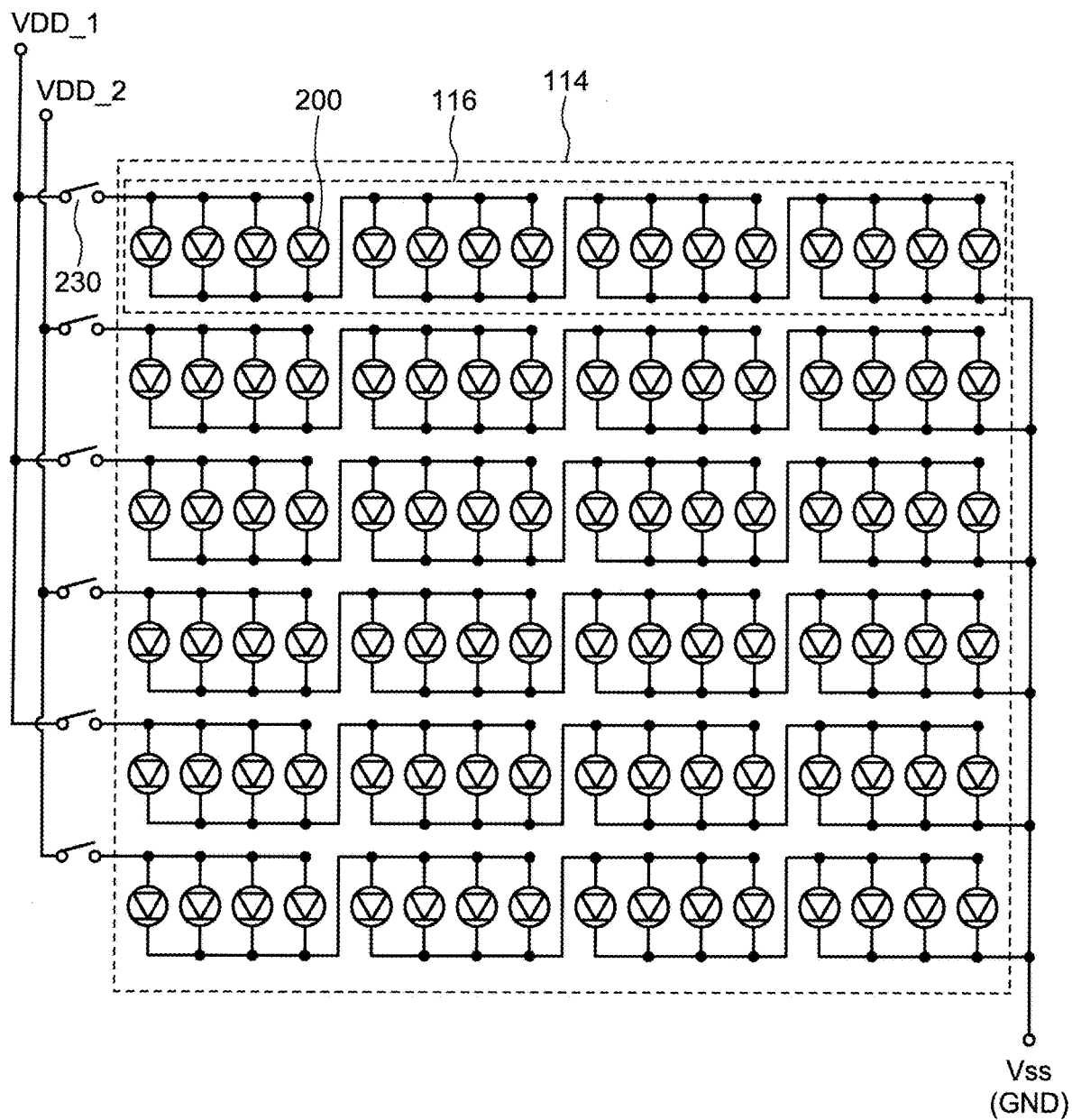
FIG. 7 shows an equivalent circuit of the LED array of the light emitting device according to an embodiment of the present invention.

FIG. 7 shows an equivalent circuit of the LED array 114. The LED array 114 includes a plurality of sub-arrays 116. The sub-array 116 has a configuration in which four LED chips 200 connected in parallel are connected in 4-stage series. The sub-array 116 is arranged for each row in the LEC array 114. The sub-array 116 is connected to a power supply line via a switching element 230. FIG. 7 shows an example in which the odd-numbered sub-arrays 116 are connected to the power supply line VDD_1 and the power supply line VSS, and the even-numbered sub-arrays 116 are connected to the power supply line VDD_2 and the power supply line VSS. The power supply voltages of the power supply lines VDD_1 and VDD_2 may be the same or different. According to the circuit configuration shown in FIG. 7, the LED chips 200 of only the even row, only the odd row, or both the even row and the odd row can be turned on, and the emission intensity can be changed by the control of the switching element 230.

The LED array 100 of the light emitting device 114 shown in FIG. 6 and FIG. 7 can be realized by a structure having an electrode pattern and a reflection pattern shown in FIG. 1. According to the present embodiment, since the LED array 114 includes the electrode pattern (first electrode pattern 202, second electrode pattern 204) and the reflection pattern 208 shown in FIG. 1, the utilization efficiency of light emitted from the LED chip 200 can be enhanced, and the power consumption of the light emitting device 100 can be reduced. The configuration of the light emitting device 100 shown in FIG. 6 and the equivalent circuit of the LED array 114 shown in FIG. 7 are examples, and the light emitting device 100 according to one embodiment of the present invention is not limited thereto.

Figure 8:
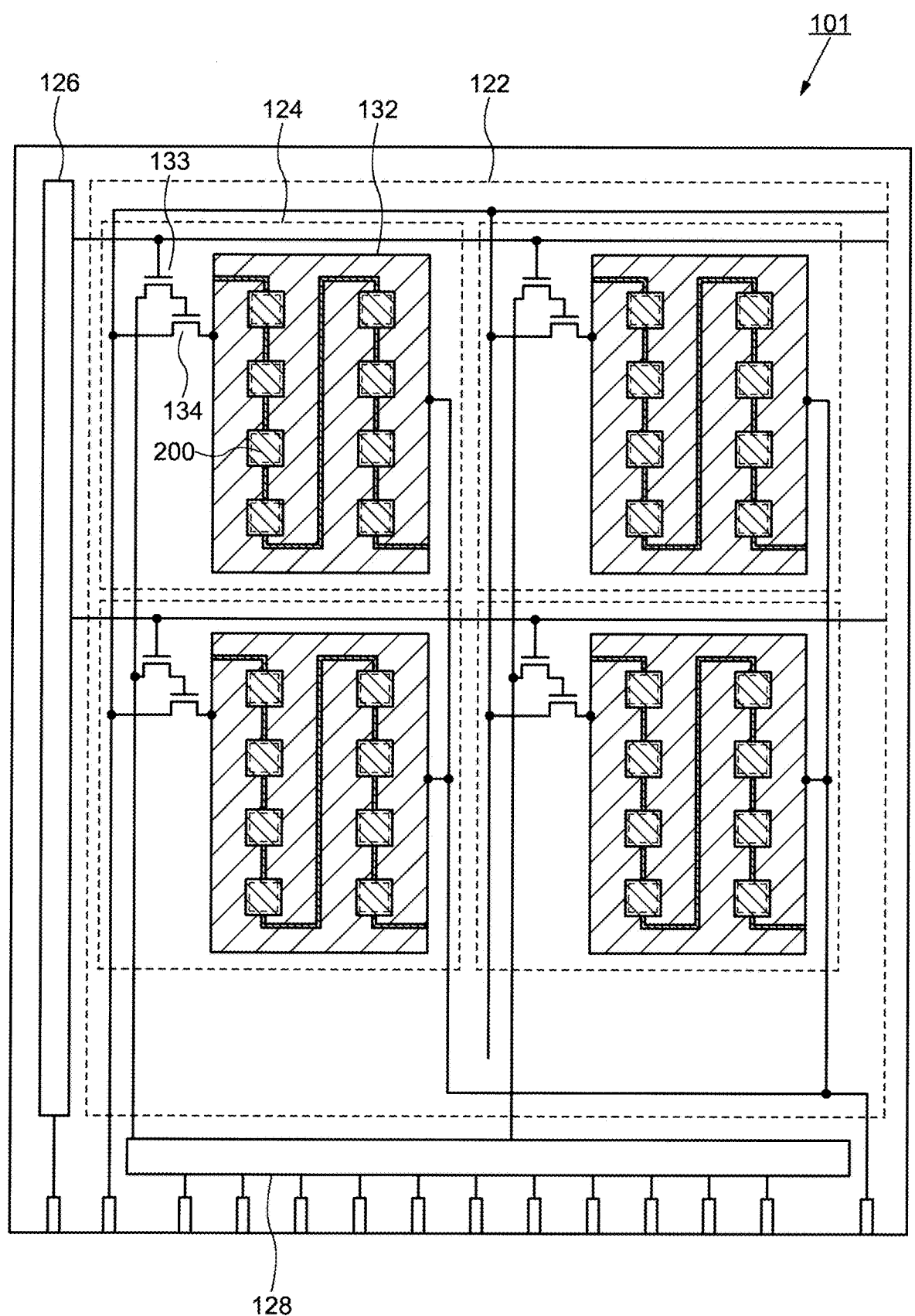
FIG. 8 shows an example of the light emitting device according to an embodiment of the present invention.

FIG. 8 shows a light emitting device 101 according to an embodiment of the present invention. The light emitting device 101 shown in FIG. 8 has a display part 122 and has a function of displaying an image. The display part 122 includes a plurality of pixels 124. Each of the plurality of pixels 124 receives a scanning signal from the scanning line driving circuit 126 and a video signal from the data line driving circuit 128. Each of the plurality of pixels 124 includes an LED array 132, a selection transistor 133, and a drive transistor 134. The LED array 132 includes an electrode pattern and a reflection pattern shown in FIG. 1. The light emission of the plurality of pixels 124 is controlled by the selection transistor 133 and the drive transistor 134. According to the present embodiment, since the LED array 132 constituting the plurality of pixels 124 includes the electrode pattern (first electrode pattern 202, second electrode pattern 204) and the reflection pattern 208 shown in FIG. 1, the utilization efficiency of light emitted from the LED chip 200 can be enhanced, and the power consumption of the light emitting device 101 can be reduced. The configuration of the pixel 124 shown in FIG. 8 is an example, and the light emitting device 101 according to one embodiment of the present invention is not limited to this. For example, in addition to the selection transistor 133 and the drive transistor 134, other transistors for controlling the operation of the pixel may be added. The configuration of the pixels shown in FIG. 8 is an example, and the light emitting device 101 according to one embodiment of the present invention is not limited thereto.

What is claimed is:

1. A light emitting device, comprising:
a first insulating layer disposed on the substrate;
at least one transistor:
a first electrode pattern and a second electrode pattern disposed on a first surface of the first insulating layer;
at least one LED chip including a first terminal and a second terminal, and the first terminal electrically connected to the first electrode pattern and the second terminal electrically connected to the second electrode pattern; and
a reflective pattern disposed on a second surface side of the first insulating layer opposite to the first surface;
wherein
the first electrode pattern and the second electrode pattern are electrically separated by a first gap,
the reflective pattern includes a linear pattern overlapping with the first gap, and
the at least one transistor is disposed between the substrate and the reflective pattern, and overlapped with the reflective pattern.

2. The light emitting device according to claim 1, wherein the at least one LED chip comprises a plurality of LED chips, and
the plurality of LED chips is spaced apart along the first gap and connected in parallel to the first electrode pattern and the second electrode pattern.

3. The light emitting device according to claim 2, wherein the reflective pattern is a discontinuous pattern and the is arranged to overlap a portion where the plurality of LED chips has separated each other.

4. The light emitting device according to claim 1, wherein the first electrode pattern and the second electrode patterns are strip-like patterns, and the first gap has a slit-like shape.

5. The light emitting device according to claim 1, wherein the first electrode pattern, the second electrode pattern, and the reflective pattern form a light reflecting surface.

6. The light emitting device according to claim 1, further comprising a display part provided with at least one pixel,
wherein the at least one pixel includes the first electrode pattern, the second electrode pattern, and the reflective pattern.

7. The light emitting device according to claim 1, further comprising a third electrode pattern, fourth electrode pattern, and wiring pattern,
wherein
the first electrode pattern and the second electrode pattern are rectangular patterns, the third electrode pattern and the fourth electrode pattern are adjacent to each other in the longitudinal direction of the first electrode pattern and the second electrode pattern, the third electrode pattern and the fourth electrode pattern are electrically separated by a second gap, and the wiring pattern electrically connects the second electrode pattern and the third electrode pattern.

8. An electrode substrate, comprising:
a first insulating layer disposed on the substrate;
at least one transistor:
a first electrode pattern and a second electrode pattern disposed on a first surface of the first insulating layer; and
a reflective pattern disposed on a second surface side of the first insulating layer opposite to the first surface, wherein
the first electrode pattern and the second electrode pattern are electrically separated by a first gap,
the reflective pattern includes a linear pattern overlapping with the first gap, and
the at least one transistor is disposed between the substrate and the reflective pattern, and overlapped with the reflective pattern.

9. The electrode substrate according to claim 8, wherein the reflective pattern is a discontinuous pattern.

10. The electrode substrate according to claim 8, wherein the first electrode pattern and the second electrode patterns are strip-like patterns, and the first gap has a slit-like shape.

11. The electrode substrate according to claim 8, wherein the first electrode pattern, the second electrode pattern, and the reflective pattern form a light reflecting surface.

12. The light emitting device according to claim 8, further comprising a third electrode pattern, fourth electrode pattern, and wiring pattern,
wherein
the first electrode pattern and the second electrode pattern are rectangular patterns,
the third electrode pattern and the fourth electrode pattern are adjacent to each other in the longitudinal direction of the first electrode pattern and the second electrode pattern,
the third electrode pattern and the fourth electrode pattern are electrically separated by a second gap, and
the wiring pattern electrically connects the second electrode pattern and the third electrode pattern.

* * * * *